(12) United States Patent
Kuzuyama et al.

(10) Patent No.: US 9,380,392 B2
(45) Date of Patent: Jun. 28, 2016

(54) MICROPHONE

(71) Applicant: OMRON Corporation, Kyoto-shi, Kyoto (JP)

(72) Inventors: Daisuke Kuzuyama, Kyoto (JP); Yasuhiro Horimoto, Kyoto (JP); Sayaka Naito, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/635,833

(22) Filed: Mar. 2, 2015

(65) Prior Publication Data

US 2015/0264463 A1    Sep. 17, 2015

(30) Foreign Application Priority Data

Mar. 14, 2014    (JP) .................................. 2014-052718

(51) Int. Cl.
    *H04R 19/00*    (2006.01)
(52) U.S. Cl.
    CPC ..................................... *H04R 19/005* (2013.01)
(58) Field of Classification Search
    CPC .......... H04R 1/08; H04R 19/00; H04R 19/04; H04R 23/00; H04R 23/006
    See application file for complete search history.

(56) References Cited

U.S. PATENT DOCUMENTS

| | | | |
|---|---|---|---|
| 6,781,231 B2 | 8/2004 | Minervini | |
| 7,242,089 B2 | 7/2007 | Minervini | |
| 8,620,014 B2 | 12/2013 | Maekawa et al. | |
| 2011/0293128 A1 | 12/2011 | Kuratani et al. | |
| 2011/0317863 A1* | 12/2011 | Inoda | H04R 19/04 381/369 |
| 2014/0312439 A1* | 10/2014 | Hoegerl | B81C 1/00238 257/416 |

FOREIGN PATENT DOCUMENTS

JP    4947191 B2    6/2012
JP    5029727 B2    9/2012

\* cited by examiner

*Primary Examiner* — Tuan D Nguyen
(74) *Attorney, Agent, or Firm* — Osha Liang LLP

(57) ABSTRACT

A microphone has a MEMS acoustic transducer having a frame-shaped support, and a membrane including a diaphragm as a movable electrode, covering an opening in the support, an integrated circuit that amplifies the output from the MEMS acoustic transducer, and a housing that houses the MEMS acoustic transducer and the integrated circuit. The housing includes a sound port bearing partition with a sound port formed therein. The MEMS acoustic transducer is secured in the housing with the membrane thereof facing the inner surface of the sound port bearing partition to form a closed space inward of the sound port bearing partition of the housing between the membrane and the sound port bearing partition. The closed space communicates with the outside via the sound port.

7 Claims, 13 Drawing Sheets

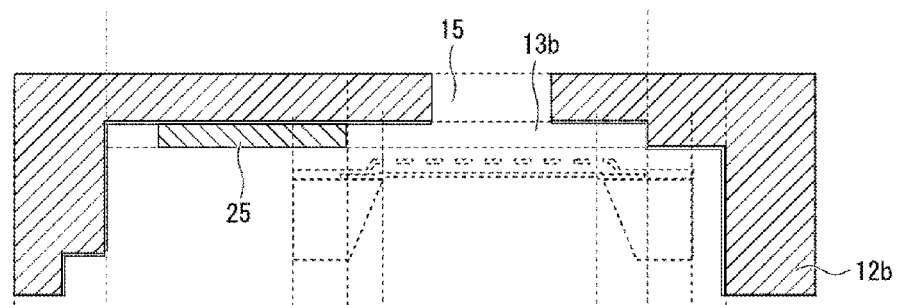
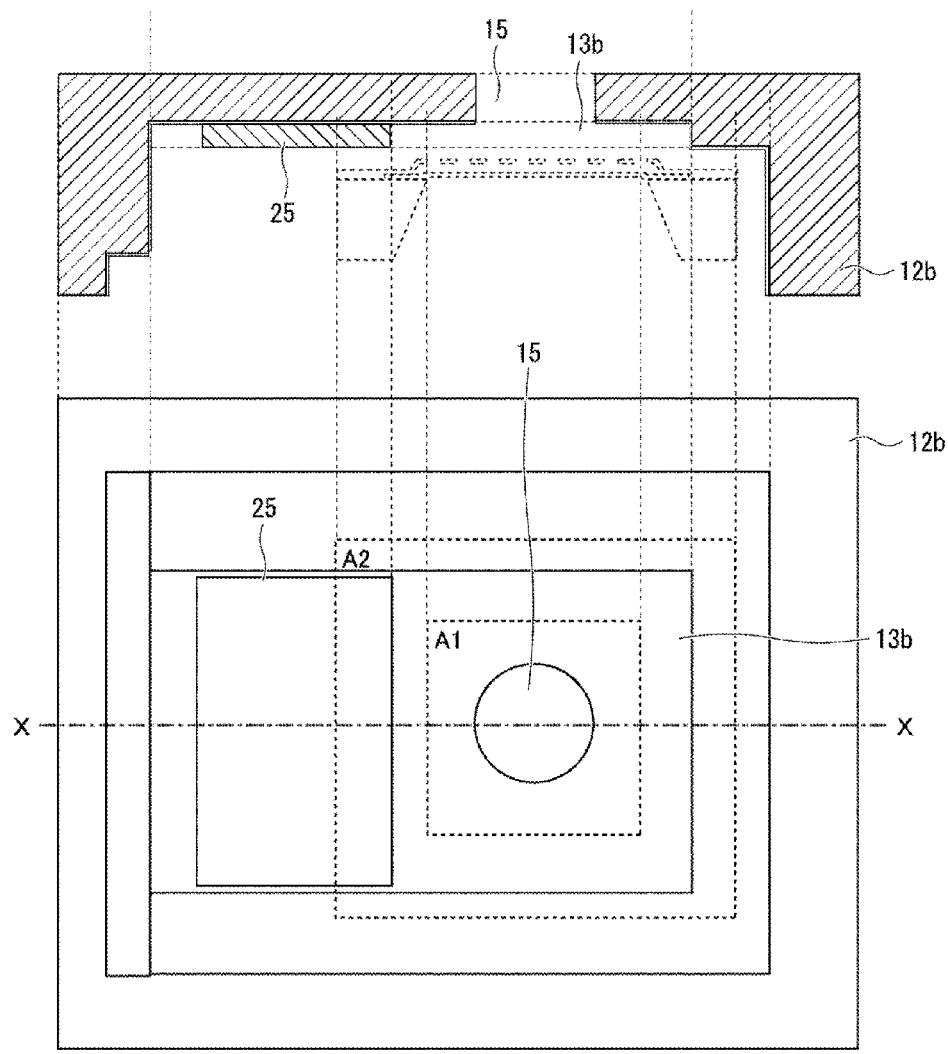

MICROPHONE

BACKGROUND

1. Field

The present invention relates to a microphone containing a micro-electromechanical system acoustic transducer within the housing of the microphone.

2. Related Art

Microphones containing micro-electromechanical system (MEMS) acoustic transducers (MEMS chips) inside the housing are provided as small form factor microphones (referred to as MEMS mics below). MEMS chips are manufactured using MEMS technology.

First, a typical MEMS mic configuration is described using FIG. 1A, and FIG. 1B. Note, the MEMS mic illustrated in FIG. 1A (refer to U.S. Pat. No. 6,781,231 for example), and the MEMS mic illustrated in FIG. 1B are top-port and bottom-port MEMS mics respectively.

As illustrated in FIG. 1A and FIG. 1B, a typical MEMS mic includes a substrate 31, a cover 32, a housing 30 constituted by the substrate 31 and the cover 32, a MEMS chip 40 (MEMS acoustic transducer), and an Application Specific Integrated Circuit (ASIC) 45. The MEMS chip 40 and the ASIC 45 are arranged side by side on the substrate 31 in the housing 30.

The MEMS chip 40 is an acoustic transducer (condenser microphone) manufactured using MEMS technology. The ASIC 45 is an integrated circuit that amplifies the output of the MEMS chip. In other words the ASIC 45 applies a direct-current voltage between the fixed electrode and the movable electrode of the MEMS chip, and outputs a change in voltage proportional to the resultant change in the capacitance of the MEMS chip.

As illustrated in FIG. 1A and FIG. 1B, usually the MEMS chip 40 is arranged on the substrate 31 so that the center line of the sound port 35 formed in the cover 32 or the substrate 31 passes substantially through the center of the diaphragm 41.

The upper surface of the substrate 31, and the inner surface of the cover 32 are lined with conductive layers 33, 34 that act as an electromagnetic shield to ensure that the microphone is resistant to electromagnetic noise. A plurality of electrodes is provided on the upper surface of the substrate 31 for connection to the plurality of electrodes (electrode pads, and terminals) on the ASIC 45. Additionally, a plurality of electrodes is provided on the under surface of the substrate, electrically connected to the electrodes on the upper surface of the substrate 31.

As further illustrated in FIG. 1A and FIG. 1B, in the typical MEMS mic, the MEMS chip 40 and ASIC 45, and the ASIC 45 and the electrodes on the upper surface of the substrate 31 are connected by wires.

In the types of MEMS mics illustrated in FIG. 1A and FIG. 1B, the space unconnected to the sound port 35 inside the housing 30 is called the back chamber. If the back chamber is narrow as schematically illustrated in FIG. 2, the air within the back chamber acts as an air spring applying a relatively large force to the diaphragm 41, which inhibits the diaphragm 41 from vibrating. If the diaphragm 41 is inhibited in vibrating, the sensitivity of the MEMS mic deteriorates. Consequently, it may be beneficial for the MEMS mic to have a large back chamber.

Furthermore, various types of MEMS mics having configurations different from the configurations illustrated in FIG. 1A and FIG. 1B have been proposed to provide a desired smaller MEMS mic.

For instance, U.S. Pat. No. 7,242,089 proposes to increase the size of the back chamber by creating a cavity 31a within the substrate 31 that functions as a back chamber as illustrated in FIG. 3.

As illustrated in FIG. 4, Japanese Registered Patent Number 5029727 further proposes providing the ASIC 45 near the substrate 31 and providing the MEMS chip 40 near the cover 32 in which the sound port 35 is formed. Finally, as illustrated in FIG. 5, Japanese Registered Patent Number 4947191 proposes providing an ASIC 45' with an opening, and overlapping the ASIC 45' and the MEMS chip 40 with the sound port 35.

SUMMARY

While various configurations of MEMS microphone have been proposed as mentioned above, the existing microphones may not contain a large back chamber; that is the existing microphones may not contain a back chamber with a volume that is proportionally larger relative to the size of the housing.

According to one or more embodiments of the present invention, a microphone has a large back chamber; that is, a microphone has a back chamber with a proportionally larger volume relative to the size of the housing.

A microphone according to one or more embodiments of the invention is configured with "a MEMS acoustic transducer including a frame-shaped support, and a membrane including a diaphragm as a movable electrode, covering an opening in the support; an integrated circuit for amplifying the output from the MEMS acoustic transducer; and a housing for housing the MEMS acoustic transducer and the integrated circuit, the housing including a sound port bearing partition with a sound port formed therein; the MEMS acoustic transducer is secured in the housing with the membrane thereof facing towards the inner surface of the sound port bearing partition to form a closed space inward of the inner surface of the sound port bearing partition of the housing between the membrane and the sound port bearing partition, the closed space communicating with the outside via the sound port".

Namely, the microphone according to one or more embodiments of the invention adopts a configuration where "the MEMS acoustic transducer is secured to the housing with the membrane thereof facing the inner surface of the sound port bearing partition to form a closed space inward of the inner surface of the sound port bearing partition of the housing between the membrane and the sound port bearing partition, the closed space communicating with the outside via the sound port". Thus, the cavity at the center of the frame-like support of the MEMS acoustic transducer functions as a portion of the back chamber in a microphone configured in this manner. Accordingly, a microphone with a large back chamber may be realized by adopting the configuration of one or more embodiments of the present invention; a microphone of the proposed configuration has substantially the same size as an existing microphone illustrated in FIG. 4, for example, while the volume of the back chamber increases by the volume of the cavity in the center of the support compared to that of the aforementioned existing MEMS mic.

When realizing a microphone according to one or more embodiments of the invention, a recess may be provided at the center portion of a region on the inner surface of the sound port bearing partition facing the MEMS acoustic transducer; and the recess is smaller than the region. Providing the above-described recess creates a comparatively wider gap between the diaphragm and the inner surface of the sound port bearing partition than when no recess is provided. Accordingly, by adopting this configuration, it is possible to prevent deterioration of the microphone's sensitivity to high-frequency sound due to the influence of the viscosity of air. Note that the center portion of the membrane does not need to include the center point of the membrane; the "center portion" may merely exclude the surrounding edges of the membrane. Moreover, the recess in the inner surface of the sound port bearing partition "may be provided facing a region containing a region hindering the spread of a die bonding material on the membrane of the MEMS acoustic transducer"; forming a recess configured in this manner creates a step on the inner surface of the sound port bearing partition that hinders the spreading of the die bonding material. Therefore, if the "recess" is configured as above described, the "recess" ensures that the die bonding material used to seal between the surrounding edges in the MEMS acoustic transducer and the inner surface of the lid portion does not spread and stick to the diaphragm.

When realizing the microphone according to one or more embodiments of the invention, "the microphone may include a recess provided on the inner surface of the sound port bearing partition of the housing with a depth substantially equal to the thickness of the integrated circuit, for storing a circuit; the integrated circuit is housed inside the recess such that a portion of the integrated circuit and a portion of the MEMS acoustic transducer overlap when viewed from the thickness direction of the integrated circuit; and the MEMS acoustic transducer is secured relative to the inner surface of the sound port bearing partition of the housing and the exposed surface of the integrated circuit housed inside the recess."

By adopting this configuration, the housing may be smaller than the size of the housing needed to arrange the integrated circuit and the MEMS acoustic transducer side by side. Accordingly, a smaller microphone, smaller than the existing microphones illustrated in FIG. 1A, FIG. 1B, and FIG. 3 may be realized by adopting the above-mentioned configuration. Additionally, adopting the above-mentioned configuration provides a microphone in which the volume of the back chamber increases by the volume of the cavity at the center portion of the support compared to the existing MEMS mic containing the overlapping ASIC 45' and MEMS acoustic transducer 40 (refer to FIG. 5).

When realizing a microphone that stores the integrated circuit in a recess for storing a circuit according to one or more embodiments of the invention, the microphone may be configured to further include "a first and a second electrode arranged on the front surface of the membrane in the MEMS acoustic transducer on a region of the MEMS acoustic transducer overlapping with a portion of the integrated circuit when viewed from the thickness direction of the integrated circuit, the first and second electrodes electrically connected to the diaphragm and the fixed electrode respectively of the MEMS acoustic transducer; and a third electrode and a fourth electrode for connection to the first and second electrodes respectively, arranged on the exposed surface of the integrated circuit in a region on the integrated circuit overlapping with a portion of the MEMS acoustic transducer when viewed from the thickness direction of the integrated circuit, the third and fourth electrodes having the same positional relationship as the positional relationship between the first and second electrodes; and the first electrode on the MEMS acoustic transducer and the third electrode on the integrated circuit, and the second electrode on the MEMS acoustic transducer and the fourth electrode on the integrated circuit are connected via flip chip bonding." On adopting this configuration, the input from the MEMS acoustic transducer to the integrated circuit is less prone to noise than when the MEMS acoustic transducer and the integrated circuit are connected via wires and the wiring is formed on the inner surface of the housing. Consequently, the above-described configuration realizes a microphone with a higher signal-to-noise ration (SNR) than microphones where the MEMS acoustic transducer and the integrated circuit are connected via wires and the wiring formed on the inner surface of the housing.

When realizing a microphone that stores the integrated circuit in a recess for storing a circuit according to one or more embodiments of the invention, the microphone may be configured to further include "a recess provided on the inner surface of the sound port bearing partition of the housing where a sidewall of the integrated circuit housed in the recess facing the center portion of the membrane on the MEMS acoustic transducer serves as a portion of the inner side-surface of the recess." The "center portion" in the configuration does not need to include the center point of the membrane; the "center portion" may merely exclude the surrounding edges of the membrane. Moreover, when realizing a microphone according to one or more embodiments of the present invention that stores the integrated circuit in a recess for storing a circuit, "the recess may be provided facing a region containing a region hindering the spread of a die bonding material on the membrane of the MEMS acoustic transducer."

Providing a recess on the inner surface of the sound port bearing partition creates a comparatively wider gap between the diaphragm and the inner surface of the sound port bearing partition than when no recess is provided. Accordingly, when adopted, this configuration prevents deterioration in the microphone's sensitivity to high-frequency sound due to the influence of the viscosity of air. Providing a recess where a sidewall of the integrated circuit housed therein serves as a portion of the inner side-surface of the recess creates a step in the sidewall section of the integrated circuit and a step on the inner surface of the sound port bearing partition, thus preventing the die bonding material from spreading. Therefore, if the "recess" is configured as above described, the configuration of the "recess" ensures that the die bonding material used to seal between the surrounding edges in the MEMS acoustic transducer and the inner surface of the lid portion does not spread and stick to the diaphragm.

When realizing a microphone that stores the integrated circuit in a recess for storing a circuit according to one or more embodiments of the invention, the following features may be adopted in the microphone. Namely, "the MEMS acoustic transducer provided with a primary recess on the inner surface of the sound port bearing partition of the housing to extend on an opposing region that faces the MEMS acoustic transducer and to include the recess for housing a circuit; and the primary recess is a shape that includes a secondary recess formed facing the center region of the MEMS acoustic transducer when the integrated circuit is housed in the recess, and a sidewall of the integrated circuit creates a stepped surface facing the opposing region". Moreover, "the primary recess is a shape that includes a secondary recess formed facing a region including a region that hinders the spreading of the die bonding material on the membrane of the MEMS acoustic transducer when the integrated circuit is housed in the recess".

Thus, according to one or more embodiments of the present invention, it may be possible to provide a microphone having a wide back chamber; that is, it may be possible to provide a microphone having a back chamber with a proportionally larger capacity relative to the size of the housing.

BRIEF DESCRIPTION OF THE DRAWINGS

FIGS. 10A-10B are explanatory diagrams illustrating the shape and location of a recess provided in the cover of a microphone according to the second embodiment;

DETAILED DESCRIPTION

Various embodiments of the invention are described below with reference to the attached drawings. Note that the invention is not limited by the below described embodiments and various modifications and changes may be made to these embodiments, and such modifications and changes are within the scope of the invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

Figure 6:
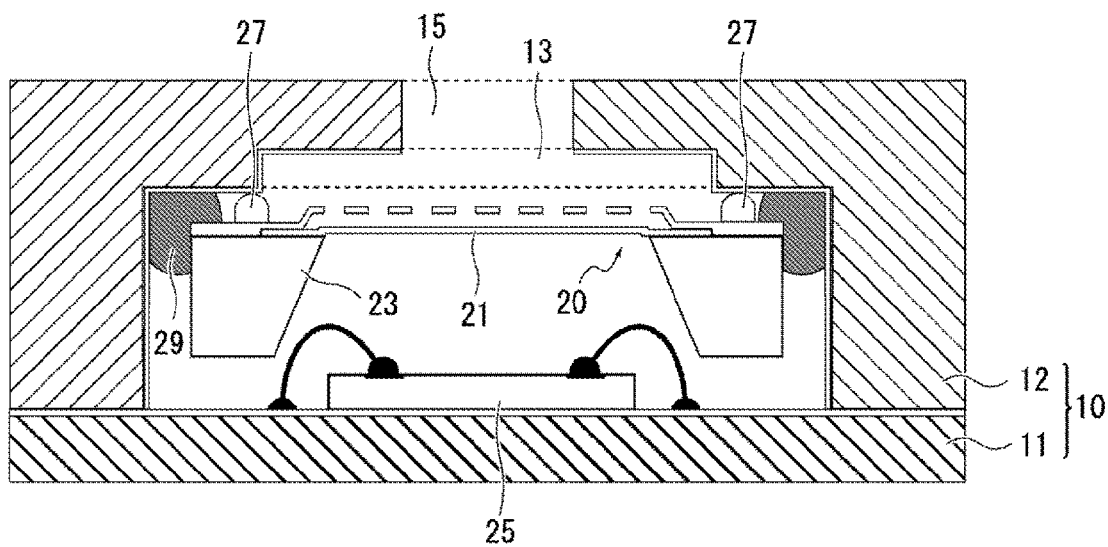
FIG. 6 is an explanatory diagram illustrating a configuration of a microphone according to a first embodiment of the present invention.

FIG. 6 illustrates a configuration of a microphone according to the first embodiment of the present invention. The scaling, number, positioning, and the like of each component of the microphone in the embodiments illustrated in FIG. 6 and subsequent drawings are appropriately modified to facilitate recognition of the components in the microphones according to the embodiments.

Figure 1A:
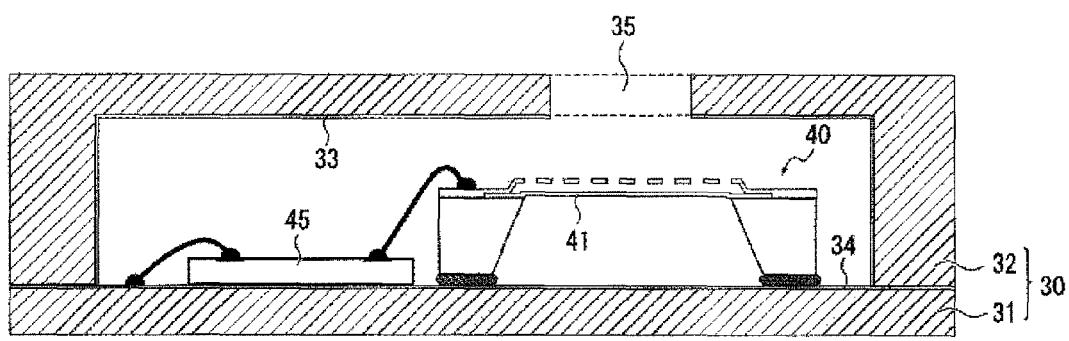
FIG. 1A is an explanatory diagram illustrating a configuration of an existing top-port MEMS mic.
Figure 1B:
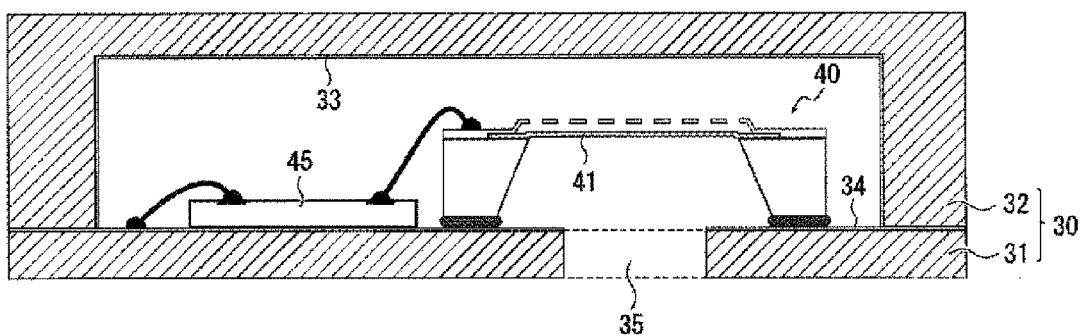
FIG. 1B is an explanatory diagram illustrating a configuration of an existing bottom-port MEMS mic.
Figure 2:
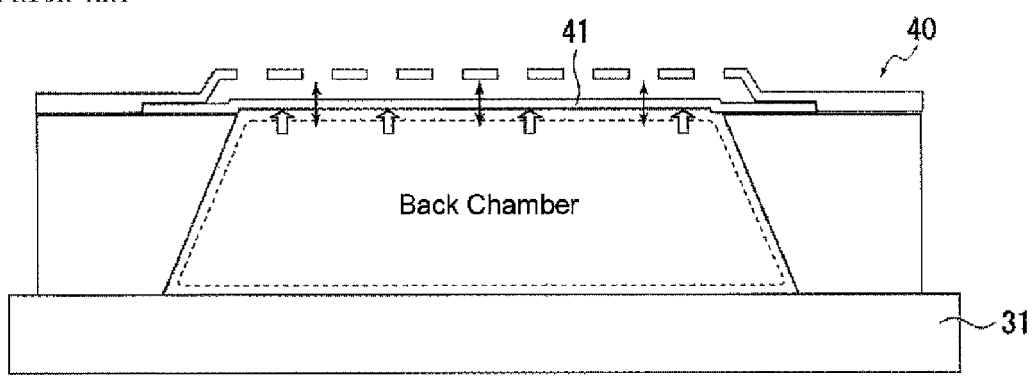
FIG. 2 is an explanatory diagram illustrating a small volume back chamber.
Figure 3:
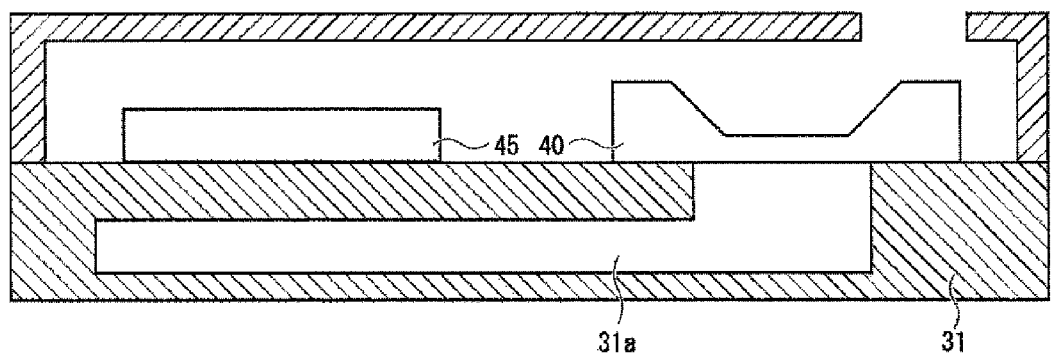
FIG. 3 is an explanatory diagram illustrating a configuration of an existing MEMS mic.

As illustrated in FIG. 6, a microphone according to the first embodiment includes a housing 10 containing a substrate 11 and a cover 12, a MEMS acoustic transducer 20, and an Application Specific Integrated Circuit (ASIC) 25, similar to existing MEMS mics (refer to FIG. 1A).

The MEMS acoustic transducer 20 (also referred to as MEMS chip 20) is an acoustic transducer produced using MEMS technology, similarly to the above-described MEMS chip 40.

More specifically, the MEMS chip 20 includes a frame-like support 23, and a membrane; the membrane covers an opening on one side of the support 23, and includes a diaphragm 21 that functions as a movable electrode. A fixed-electrode connection electrode, and a movable-electrode connection electrode are provided on the surrounding edges of the upper surface (the surface at the upper part of FIG. 6) of the membrane in the MEMS chip 20; the fixed-electrode connection electrode is a fixed electrode terminal and connecting pad that are electrically connected to the fixed electrode; the movable-electrode connection electrode is electrically connected to the diaphragm 21 (movable electrode) in the MEMS chip 20. Furthermore, a plurality of metallic films (in other words non-electrode metal films) is also provided on the surrounding edges of the upper surface of the MEMS chip 20 for the purpose of mounting bumps 27.

The MEMS chip 20 used in the microphone according to the first embodiment may have the fixed-electrode connection electrode and the movable-electrode connection electrode provided on the same end of the membrane, or may have the fixed-electrode connection electrode and movable-electrode connection electrode provided on the different ends of the membrane.

Figure 9:
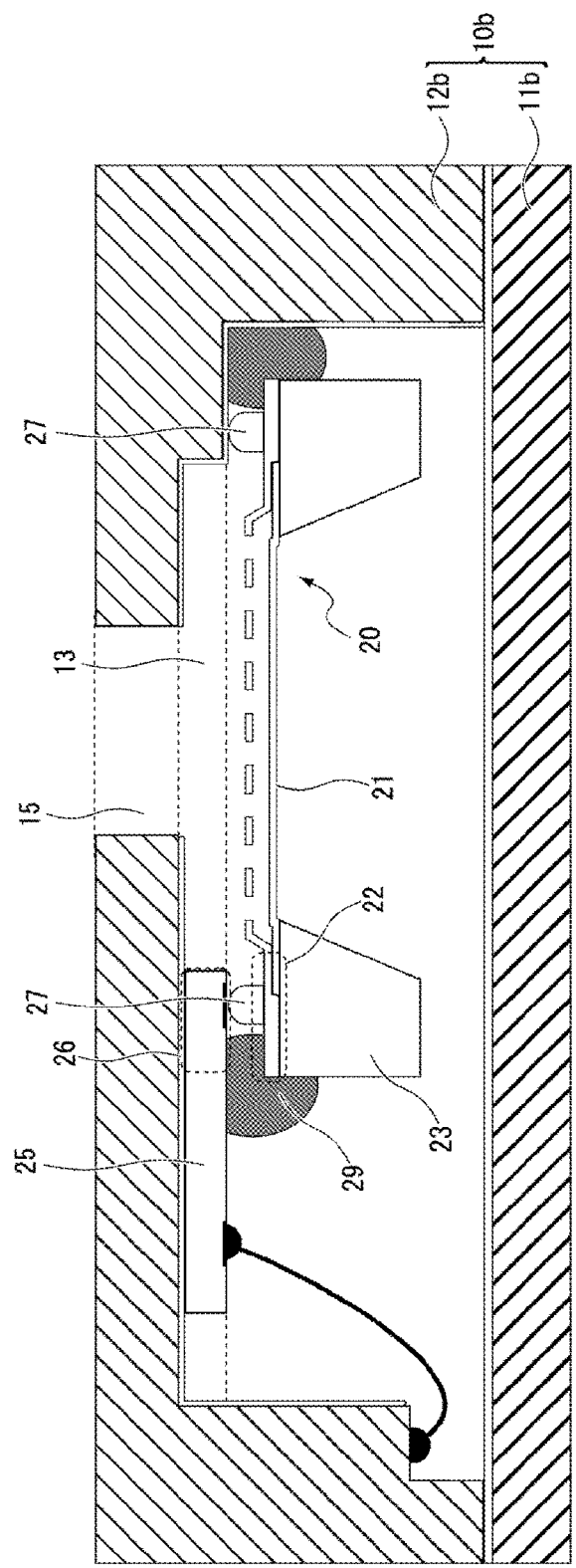
FIG. 9 is an explanatory diagram illustrating a configuration of a microphone according to a second embodiment of the present invention.

The ASIC 25 is an integrated circuit that amplifies the output of the MEMS chip 20, similarly to the ASIC 45. In other words the ASIC 25 applies a direct-current voltage between the fixed electrode and the movable electrode of the MEMS chip 20, and outputs a change in voltage proportional to the resultant change in the capacitance of the MEMS chip 20. The lower part of FIG. 9 illustrates a surface of the ASIC 25 provided with electrodes for connection to movable-electrode connection electrode of the MEMS chip 20, to the fixed-electrode connection electrode of the MEMS chip 20, and a plurality of external device electrodes for connection to an external device.

The substrate 11 is a so-called printed circuit board. A conductive electromagnetic shield film, a plurality of electrodes, and a plurality of electrodes connected with wires to a plurality of electrodes provided on the upper surface of the ASIC 25 are formed on the upper surface of the substrate 11.

The electrodes provided on the upper surface of the substrate 11 include a first type of electrode that connects to a specific electrode on the ASIC 25 (the electrode for connection to the MEMS chip 20), and a second type of electrode that connects to the other electrodes on the ASIC 25 (the electrodes for connection to an external device); a plurality of electrodes for connection to an external device are provided on the under surface of the substrate 11 and electrically connected to each second type of electrode on the upper surface of the substrate 11.

The substrate 11 is further provided with wiring used for the purpose of connecting each first type of electrode on the upper surface of the substrate 11 to the electrodes for connection to the fixed electrode and the movable electrode of the MEMS chip 20 respectively via connection wiring formed on the inner surface of the cover 12, or more precisely, formed on the inner surface and the under surface of the cover 12).

The cover 12 is a lidded polygonal cylinder with a sound port 15 formed in the lid portion. The lid portion of the cover 12 is provided with a recess 13 at the center section of the inner surface thereof; the recess is approximately 0.05 mm to 0.1 mm deep. Here, the lid portion of the cover 12 refers to the plate-like segment at the upper part of the cover 12 in FIG. 6.

Moreover, the lid portion of the cover 12 is usually approximately 0.2 mm to 0.3 mm thick. The inner surface of the lid portion of the cover 12 refers to the surface at the lower part of the lid portion of the cover 12 in FIG. 6 (i.e., the surface on which the MEMS chip 20 is mounted). Finally, the depth of the recess 13 refers to the vertical length of the recess 13 in FIG. 6.

Next, the shape and location of the recess 13 is described below.

Figure 7A:
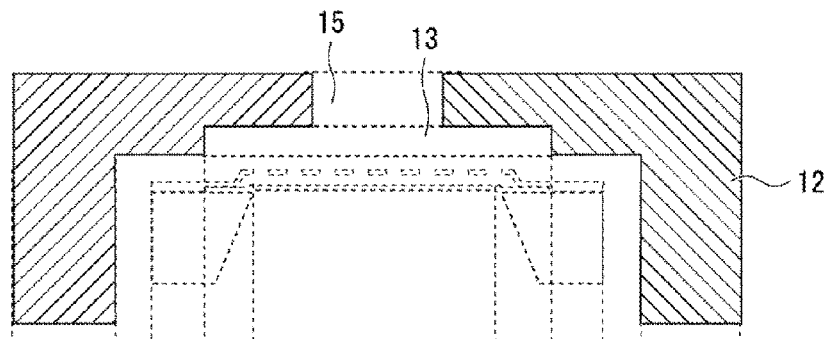
FIGS. 7A-7B are explanatory diagrams illustrating the shape and location of a recess provided in the cover of a microphone according to the first embodiment.
Figure 7B:
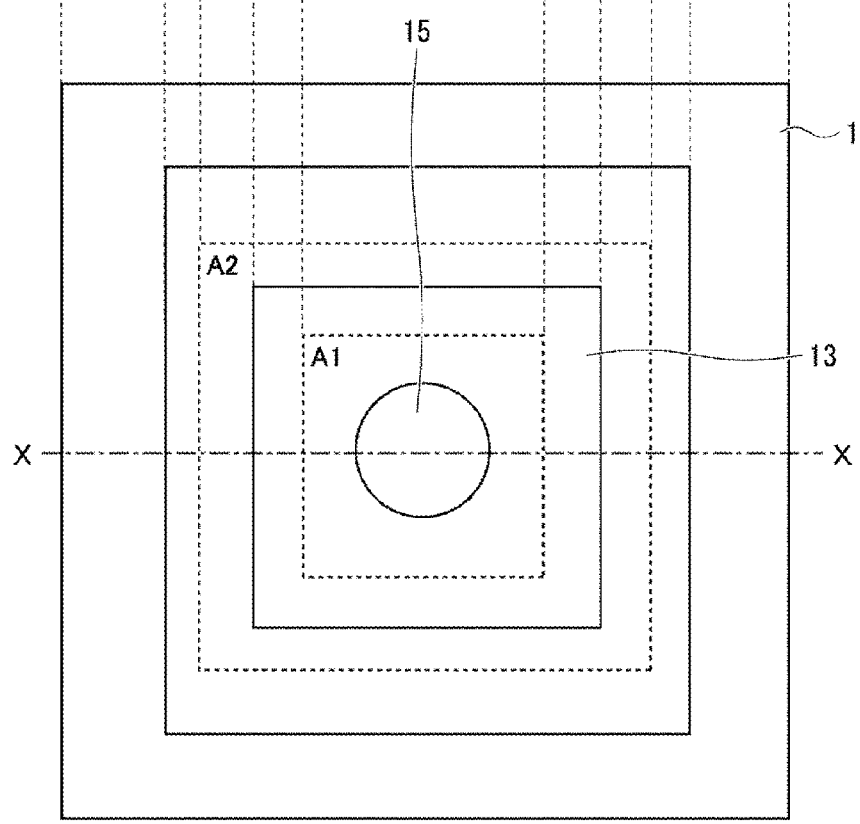

FIG. 7B is a plan view illustrating the cover 12 when viewed from below (from the substrate 11); FIG. 7A is a cross-sectional view of the cover 12 along the line X-X in FIG. 7B. Note that the region A1 illustrated by a dotted frame in FIG. 7B is a region within the inner surface of the cover 12 opposite the diaphragm 21 of the MEMS chip 20 when the MEMS chip 20 is arranged inside the cover 12 such that a centerline through the sound port 15 passes substantially through the center of the diaphragm 21; this arrangement is also referred to below as the MEMS chip 20 being arranged at the "designed location". When the MEMS chip 20 is arranged at the designed location, the region A2, illustrated by a dotted frame, is on the inner surface of the cover 12 facing the MEMS chip 20.

As is clear from FIGS. 7A, 7B the recess 13 in the cover 12 is formed to be larger than the region A1 and smaller than region A2; that is, the recess 13 contains region A1, and the region A2 contains the recess 13. Additionally, the location at which the recess 13 is formed is defined such that the center of the recess 13 substantially coincides with the center of the membrane in the MEMS chip 20.

Returning to FIG. 6, the microphone according to the first embodiment is further described.

A connection wiring is provided on the inner surface of the cover 12 for connecting the fixed-electrode and movable-electrode connection electrodes in the MEMS chip 20 to each first type of electrode on the upper surface of the substrate 11 via the wiring formed on the substrate 11. A conductive electromagnetic shield film is also provided on the inner surface of the cover 12.

MEMS chip connection electrodes are provided at the ends of each connection wiring near the lid portion. The locations of the MEMS chip connection electrodes are defined such that the MEMS chip connection electrodes are opposite the fixed-electrode and movable-electrode connection electrodes in the MEMS chip 20 when the MEMS chip 20 is arranged at the designed position.

Simply put, the cover 12 is configured to function as a substrate that allows the MEMS chip 20 to be bonded using flip-chip bonding. As above described, the upper surface of the substrate 11 is provided with a first type of electrode formed on the inner surface of the cover 12 and electrically connected to the connection wiring formed on the inner surface of the cover 12 when combined with the cover 12; and a second type of electrode conductive with the external-device connection electrodes on the under surface of the substrate 11.

Thus, a microphone according to the first embodiment may be assembled from the following processes and procedures:
form a metal electromagnetic shield film on a cover 12;
apply a die bonding material around the recess 13 on the electromagnetic-shielded cover 12 (i.e., the section on the cover 12 opposite the surrounding edges of the MEMS chip 20); bond the inner surface of the lid portion of the cover 12 and the MEMS chip 20 via flip-chip bonding.

secure the ASIC 25 on the substrate 11; connect the electrodes on the upper surface of the secured ASIC 25 and the electrodes on the substrate 11 via wire bonding.

The microphone is thus obtained through assembling the structural elements obtained via both of the above processes.

The reasoning for providing the recess 13 on the inner surface of the lid portion of the cover 12 is as follows.

The above-described frame-like recess 13 is provided between the regions A1, A2 in the inner surface of the lid portion because providing the recess 13 configured in this manner prevents the die bonding material 29 from spreading toward and sticking to the diaphragm 21 during the process of assembling the cover 12; the configuration also prevents a deterioration in the microphone' sensitivity to high-frequency sound due to the influence of the viscosity of air.

Figure 8:
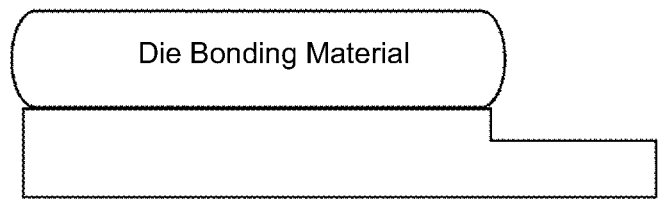
FIG. 8 is an explanatory diagram illustrating the function of the recess.

More specifically, the die bonding material, applied to a flat surface, spreads outside of the region to which it is applied. However, if there is a step in the flat surface to which the die bonding material is applied, the die bonding material spreads up to, but does not spread beyond the step as illustrated in FIG. 8. Therefore, providing the above-described frame-like recess 13 between the above-described regions A1, A2 in the inner surface of the lid portion of the cover 12 thereby prevents the die bonding material 20 from spreading up to and sticking to the diaphragm 21.

Now, if the sound port 15 and the diaphragm 21 are the same size, debris and the like will tend to enter inside the housing 10. Consequently, the sound port 15 is usually made smaller than the diaphragm 21; despite this, when the sound port 15 is smaller than the diaphragm 21, sound waves are not directly incident on the outer periphery of the diaphragm 21 in the MEMS chip 20 (i.e., the sound waves reflected in the microphone will be incident on the outer periphery of the diaphragm 21). When there is a wide gap between the upper surface of the diaphragm 21 and the lower surface of the lid portion of the cover 12, that there are portions on the diaphragm 21 where sound waves are not directly incident does not particularly pose a problem. In contrast, if there is a narrow gap between the upper surface of the diaphragm 21 and the lower surface of the lid portion of the cover 12, the sensitivity of the microphone to high-frequency sound tends to deteriorate; reason being, the sound waves, and particularly high-frequency sound waves which tend to be affected by the viscosity of air, tend not to be incident at the outer periphery of the diaphragm 21.

However, as long as the above-described frame-like recess 13 is provided between the above-described regions A1, A2, in the inner surface of the lid portion of the cover 12, it is still possible for the high-frequency sound waves to be incident on each portion of the diaphragm 21 even if there is a narrow gap (without the recess 13) between the upper surface of the diaphragm 21 and the lower surface of the lid portion of the cover 12. For this reason, the recess 13 of the above-described form is provided at the above-described location in the inner surface of the lid portion of the cover 12.

As above described, a microphone according to the first embodiment adopts a configuration where the MEMS chip 20 is secured to the inner surface of a partition (the lid portion of the cover 12) in the housing 10 in which the sound port 15 is formed with the membrane of the MEMS chip 20 facing that inner surface of the housing. Adopting the above configuration allows cavity at the center of the support 23 to also function as a portion of the back chamber.

Figure 4:
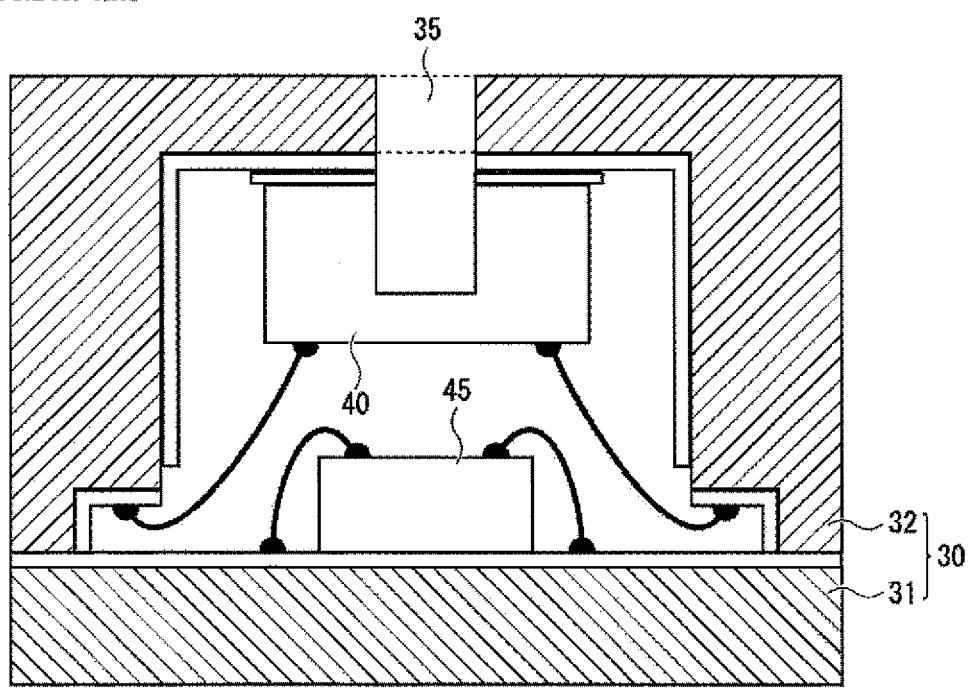
FIG. 4 is an explanatory diagram illustrating a configuration of an existing MEMS mic.

Accordingly, a microphone with a large back chamber may be realized by adopting the configuration of the first embodiment; a microphone of the proposed configuration has substantially the same size as an existing microphone illustrated in FIG. 4, for example, while the volume of the back chamber increases by the volume of the cavity in the center of the support 23 compared to that of the aforementioned existing MEMS mic.

Second Embodiment

The configuration of a microphone according to a second embodiment of the present invention is described using FIG. 9 to FIG. 11B; the portions of the second embodiment described are primarily the portions different from the portions in the microphone according to the first embodiment.

As illustrated in FIG. 9, a microphone according to the second embodiment is provided with a housing 10b containing a substrate 11b, a cover 12b, a MEMS acoustic transducer 20, and an ASIC 25.

The MEMS acoustic transducer 20 (also referred to as MEMS chip 20 below) and the ASIC 25 in the microphone according the second embodiment are essentially the same as the MEMS acoustic transducer 20 and the ASIC 25 respectively in the microphone according to the first embodiment.

However, the microphone according to the second embodiment uses a MEMS chip 20 where the fixed-electrode connection electrode and the movable-electrode connection electrode are provided on the upper surface of the left end 22 (also referred to as connection end 22) of the membrane illustrated in FIG. 9. Moreover, the microphone according to the second embodiment uses an ASIC 25 where an electrode for connection to the fixed-electrode connection electrode, and an electrode for connection to the movable-electrode connection electrode respectively on the MEMS chip 20 are provided on the under surface of the right end 26 (referred to below as the IC-connection end 26) of the ASIC 25 illustrated in FIG. 9.

Simply put, a portion of the ASIC 25 (i.e., a portion, or all of one end of the ASIC 25) and a portion of the MEMS chip (i.e., a portion, or all of one end of the MEMS chip 20) are arranged to overlap within the housing 10b of the microphone according to the second embodiment when viewed in the thickness direction of the ASIC 25. The MEMS chip 20 used in the second embodiment has the fixed-electrode connection electrode and the movable-electrode connection electrode arranged on the front surface of the connection end 22 of the membrane. The connection end 22 is the end overlapping with a portion of the ASIC 25. Additionally, the ASIC 25 used in the second embodiment has the electrode for connection to the fixed-electrode connection electrode, and the electrode for connection to the movable-electrode connection electrode arranged on the front surface of the IC-connection end 26. The IC-connection end 26 is the end overlapping with a portion of the MEMS chip 20.

The substrate 11b is provided with a plurality of external-device connection electrodes on the under surface thereof, similarly to the substrate 11. However, only the electromagnetic-shielding electrode film, and the connection electrodes are provided on the upper surface of the substrate 11b; the connection electrodes come into contact with the electrodes of the connection wiring formed on the inner surface (or, more accurately, the inner surface and the under surface) of the cover 12b when the cover 12b and the substrate 11b are combined. The substrate 11b also includes wiring formed on the inside thereof for connecting the connection electrodes to the external-device connection electrodes.

The cover 12b is also a lidded polygonal cylinder that is longer horizontally than the cover 12. In addition to the above-mentioned connection wiring and the like, a conductive electromagnetic shield film is also provided on the inner surface of the cover 12b.

The cover 12b is provided with a recess 13b in the inner surface at the center of the lid portion; the ASIC 25 can be housed inside the recess 13 (refer to the location illustrated in FIG. 9). That is, the recess 13b is provided in the inner surface at the center of the lid portion of the cover 12b, so that the recess 13b can house the ASIC 25 at a position where the IC-connection end 26 of an ASIC 25 overlaps with the connection end 22 of a MEMS chip 20 arranged at the designed position when the ASIC 25 is viewed from the thickness direction.

In practical terms, the form of the recess 13b is defined on the basis of the sizes of the MEMS chip 20 and the ASIC 25 used in the microphone.

For instance, a recess 13b of the form illustrated in FIG. 10 may be provided in the cover 12b when the length of the ASIC 25 in a direction orthogonal to the drawing sheet including FIG. 9 (referred to below as the longitudinal direction) is shorter than the length of the MEMS chip 20 in the longitudinal direction.

Note, FIG. 10B is a plan view of the cover 12b with the ASIC 25 housed inside the recess 13b, when viewed from below (from the substrate 11b).45 FIG. 10A is a cross-sectional view of the cover 12b along the line X-X in FIG. 10B with the ASIC 25 housed inside the recess 13b. In addition, when the MEMS chip 20 is arranged at the designed position, the region A1 illustrated by the dotted frame in FIG. 10B is a region on the inner surface of the cover 12b that faces the diaphragm 21 of the MEMS chip 20; the designed position refers to a position inside the cover 12b where the MEMS chip 20 is arranged so that a center line through the sound port 15 passes substantially through the center of the diaphragm 21. When the MEMS chip 20 is arranged at the designed position, the region A2 illustrated by the dotted frame is a region on the inner surface of the cover 12b that faces the MEMS chip 20.

That is, when the ASIC 25 is shorter than the MEMS chip 20 lengthwise, the position of the left sidewall of the recess 13 (refer to FIG. 7) may be extended up to the location of the left sidewall of the cover 12 covering the ASIC 25. This effectively creates the recess 13b formed by adding another recess to the recess 13 to house the ASIC 25.

Figure 11A:
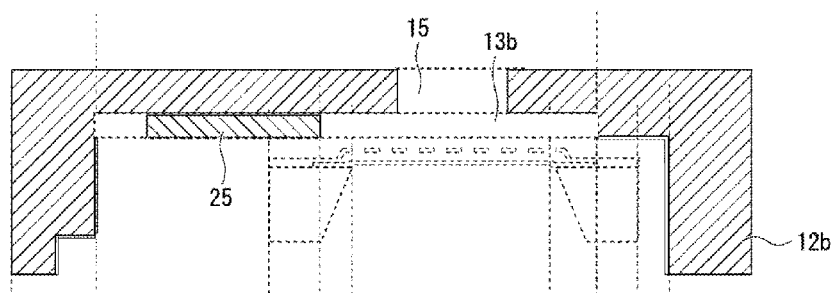
FIGS. 11A-11B are explanatory diagrams illustrating the shape and location of the recess provided in the cover of a microphone according to the second embodiment.
Figure 11B:
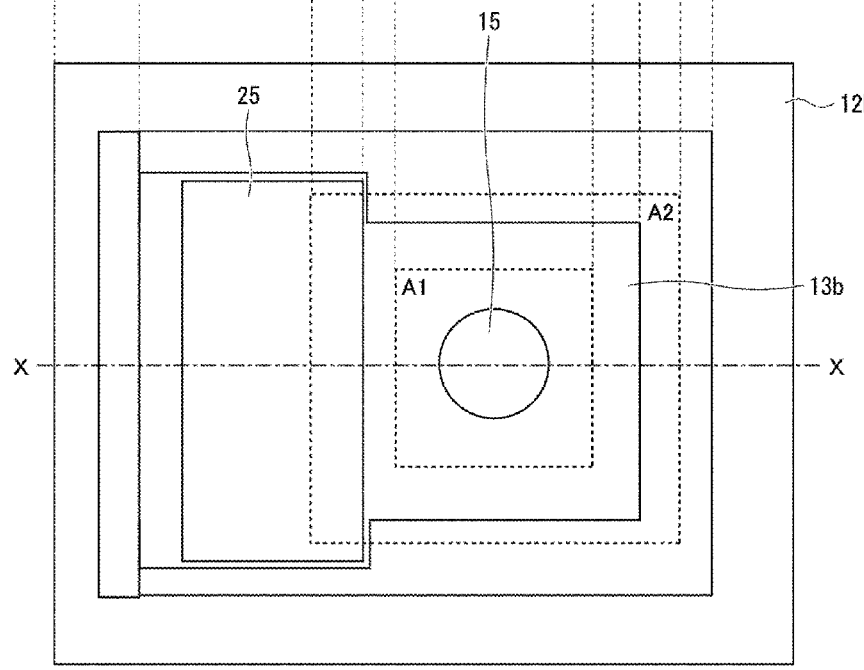

Additionally, when the ASIC 25 is longer than the MEMS chip 20 lengthwise, a recess 13b having the form illustrated in FIGS. 11A-11B may be created in the cover 12b. That is, in this case merely extending the left side of the recess 13 does not provide a recess 13b capable of housing the ASIC 25 therein. Therefore, when the ASIC 25 is longer than the MEMS chip 20 lengthwise, the recess 13b must be longer lengthwise (the vertical direction in FIG. 10B) at the section that houses the ASIC 25.

The depth at each portion of the recess 13b provided in the cover 12b is usually substantially equivalent to the thickness of the ASIC 25. However, the recess 13b may be provided in the cover 12b so that the depth of the section of the recess 13b housing the ASIC 25 may be equal to the thickness of the ASIC 25, while the section of the recess 13b near the sound port 15 may have different thicknesses than the section of the recess housing the ASIC 25.

The constituent elements of the microphone according to the second embodiment are as above described. Thus, as is clear from FIG. 9, a microphone according to the second embodiment may be assembled from the following processes and procedures:

A microphone according to the second embodiment may be structured such that the ASIC 25 is disposed at a prescribed location (the location illustrated in FIG. 9) inside the recess 13b on the inner surface of the lid portion of the cover 12.

Alternatively, the ASIC 25 may be disposed inside the recess 13b on the inner surface of the lid portion of the cover 12.escribed location (theon of the cover 12b facing the surrounding edges of the MEMS chip 20 (i.e., the sections on the ASIC 25, and the lid portion of the cover 12b); bond the inner surface of the lid portion of the cover 12b and the MEMS chip 20 via flip-chip bonding. Alternatively, bond the MEMS chip 20 via flip-chip bonding, and subsequently flow the die bonding material to seal between the surrounding edges of the MEMS chip 20 and the lid portion of the cover 12b.

Alternatively, bond the MEMS chip 20 via flip-chip bonding, ASIC 25 and the electrode for connecting to the connection wiring via wire bonding.

Alternatively, bond the MEMS chip 20 via flip-chip bonding, ASIC 25 and the electrode for connecting to the connection wiring via wire bonding.es of the MEMS chip 20 and th, the structure resulting from installing the MEMS chip 20 and the like in the cover 12b), and the substrate 11b to obtain the microphone.

As above described, a microphone according to the second embodiment adopts a configuration where the MEMS chip 20 is secured to the inner surface of a section (the lid portion of the cover 12b) in the housing 10 in which the sound port 15 is formed with the membrane 22 of the MEMS chip 20 facing that inner surface of the housing 10. Adopting the above configuration allows a cavity at the center of the support to also function as a portion of the back chamber. Accordingly, it is possible to realize a microphone in which the volume of the back chamber increases at least by the volume of the cavity in the center of the support by adopting the configuration of the microphone of the second embodiment.

Figure 5:
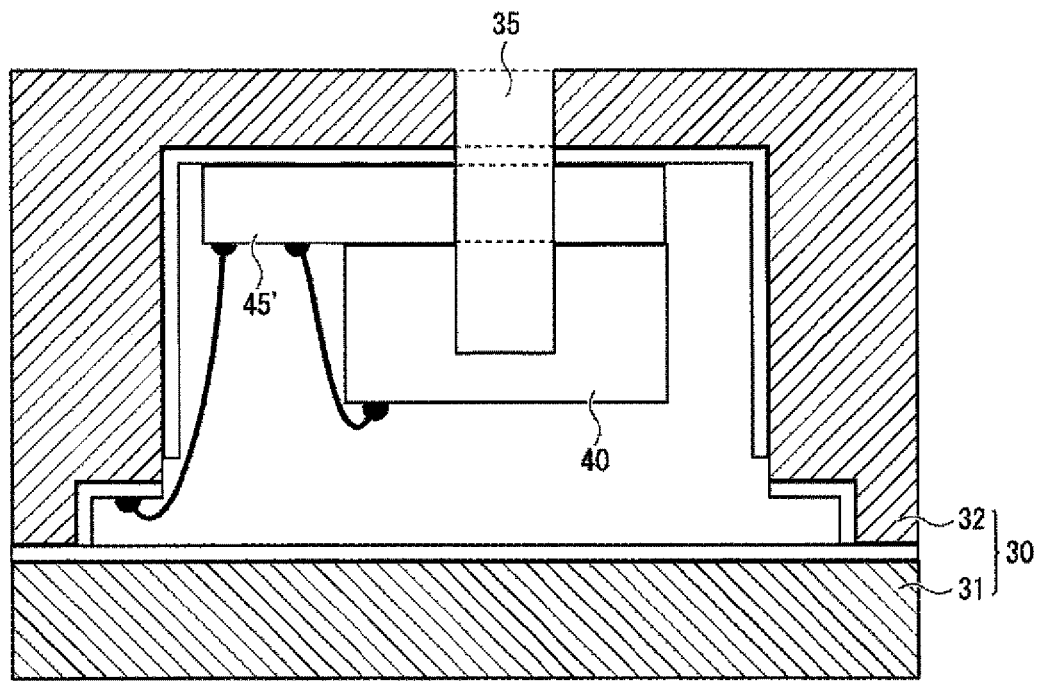
FIG. 5 is an explanatory diagram illustrating a configuration of an existing MEMS mic.

Adopting the above-described configuration, there is no longer need to use a housing 10b that lines up the ASIC 25 and the MEMS chip 20 (refer to FIG. 1A). Accordingly, by adopting the above-described configuration, a smaller microphone may be realized. Moreover, if the MEMS chip 20 and the ASIC 25 are connected by a flip-chip bonding, the output of the MEMS chip 22 to the ASIC 25 is less prone to noise compared to when the MEMS chip 20 and the ASIC 25 are connected via wires and the wiring formed on the inner surface of the housing. Thus, a microphone having a higher and improved signal-to-noise ratio may be realized by adopting the above-described configuration compared to a microphone (refer to FIG. 1A, FIG. 4, FIG. 5) wherein the MEMS chip 20 and ASIC 25 are connected via wires and the wiring formed on the inner surface of the housing.

The section further right of the ASIC 25 inside the recess 13b in the microphone according to the second embodiment has substantially the same form as the recess 13 in the microphone according to the first embodiment.

Therefore, the configuration adopted in the microphone according to the second embodiment also prevents the die bonding material from spreading up to the diaphragm portion of the membrane and adhering to the diaphragm; the configuration also prevents the deterioration of the microphone's sensitivity to high-frequency sound due to the influence of the viscosity of air.

Third Embodiment

Figure 12:
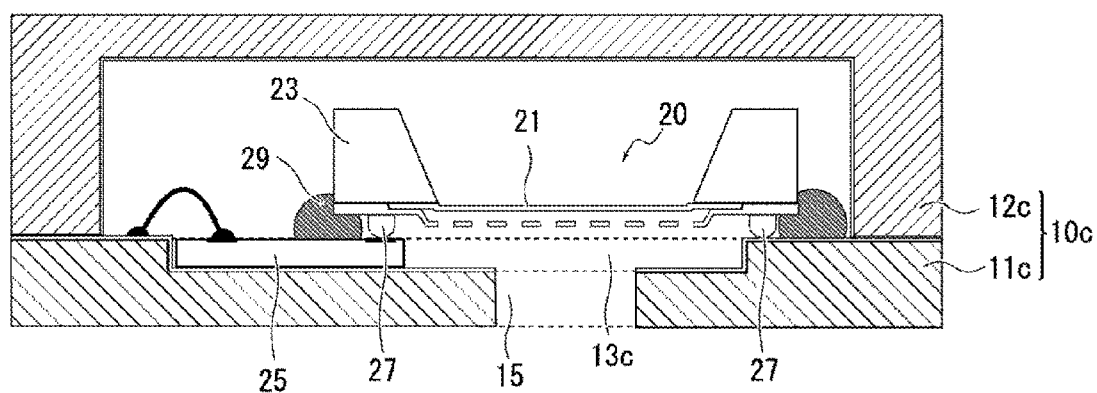
FIG. 12 is an explanatory diagram of a configuration of a microphone according to a third embodiment of the present invention.

FIG. 12 illustrates a configuration of a microphone according to a third embodiment of the present invention.

As is clear from comparing FIG. 9 and FIG. 12, the microphone according to the third embodiment is modified into a bottom-port microphone while the microphone in the second embodiment is a top-port microphone.

The microphone of the third embodiment may be obtained by modifying the housing 10b (substrate 11b, and cover 12b) of the microphone according to the second embodiment into the housing 10c (substrate 11c, and cover 12c). The microphone according to the third embodiment may also use the cover 12b where the entire inner surface is covered with a metallic electromagnetic shield film; note, a detailed explanation of the functional effects provided by this configuration of the microphone is omitted. Furthermore, similar to the microphone of the second embodiment, adopting the configuration of the third embodiment may also provide a microphone having a large volume back chamber with improved signal-to-noise ratio; moreover, the signal-to-noise ratio improves compared to a microphone where the MEMS chip 20 and ASIC 25 are connected via wires and wiring formed on the inner surface of the housing. Finally, the configuration adopted in the microphone according to the third embodiment also prevents the die bonding material from spreading up to the diaphragm portion of the membrane and adhering to the diaphragm; the configuration also prevents the deterioration of the microphone's sensitivity to high-frequency sound due to the influence of the viscosity of air.

Exemplary Modifications

Various modifications may be made to the microphone according to the above-described embodiments. For example, the microphone according to the first embodiment may be modified into a bottom-port microphone. Additionally, instead of providing a recess on the inner surface of the lid portion of the cover, the microphone according to the first embodiment may be modified to increase the height of the bumps and the height of the edges surrounding the MEMS chip to thereby adjust the gap between the diaphragm and the under surface of the lid portion of the cover. The microphone in the second and the third embodiments may be modified by providing only the recess for storing the ASIC 25 therein on the inner surface of the lid portion of the cover and above the upper surface of the substrate; these embodiments may also be modified by increasing the height of the bumps and the edges surrounding the MEMS chip to thereby adjust the gap between the diaphragm and the under surface of the lid portion of the cover.

Furthermore, in the microphone according to one or more of the above-described embodiments, the MEMS chip 20 is arranged such that a center line through the sound port 15 passes through substantially the center of the diaphragm 21; however, any kind of positional relationship between the sound port 15 and the MEMS chip 20 is permissible so long as a closed space is formed between the plate-like section (i.e., the lid portion of the cover, or the substrate) in which the sound port 15 is formed and the membrane of the MEMS chip 20, and the sound port 15 allows the closed space to communicate with the outside.

Finally, the microphone according to one or more of the above-described embodiments may be modified such that the electrodes for the MEMS chip 20 and the electrodes on the inner surface of the lid portion of the cover 12 and on the ASIC 25 are connected via bonding methods other than flip-chip bonding, such as wire bonding. However, the manufacturing process becomes more complicated if the microphone is modified in this manner. Therefore, according to one or more embodiment of the present invention, the connections between the electrodes on the MEMS chip 20 and the electrodes on the inner surface of the lid portion of the cover 12 and on the ASIC 25 are made via flip-chip bonding.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A microphone comprising: a MEMS acoustic transducer comprising: a frame-shaped support, and a membrane including a diaphragm as a movable electrode, covering an opening in the support; an integrated circuit that amplifies the output from the MEMS acoustic transducer; and a housing that houses the MEMS acoustic transducer and the integrated circuit, wherein the housing includes a sound port bearing partition with a sound port formed therein, wherein the MEMS acoustic transducer is secured in the housing with the membrane thereof facing the inner surface of the sound port bearing partition to form a closed space inward of the sound port bearing partition of the housing between the membrane and the sound port bearing partition, wherein the closed space communicates with the outside via the sound port and wherein the microphone further comprising: a recess provided at the center portion of a region on the inner surface of the sound port bearing partition facing the MEMS acoustic transducer, wherein the recess is smaller than the region on the inner surface facing the MEMS acoustic transducer.

2. The microphone according to claim 1, wherein the recess is provided facing a region containing a region hindering the spread of a die bonding material on the membrane of the MEMS acoustic transducer.

3. A microphone comprising:
   a MEMS acoustic transducer comprising:
      a frame-shaped support, and
      a membrane including a diaphragm as a movable electrode, covering an opening in the support;
   an integrated circuit that amplifies the output from the MEMS acoustic transducer: and
   a housing that houses the MEMS acoustic transducer and the integrated circuit,
   wherein the housing includes a sound port bearing partition with a sound port formed therein,
   wherein the MEMS acoustic transducer is secured in the housing with the membrane thereof facing the inner surface of the sound port bearing partition to form a closed space inward of the sound port bearing partition of the housing between the membrane and the sound port bearing partition,
   wherein the closed space communicates with the outside via the sound port,
   wherein the microphone further comprises a recess that stores a circuit provided on the inner surface of the sound port bearing partition of the housing with a depth substantially equal to the thickness of the integrated circuit,
   wherein the integrated circuit is housed inside the recess such that a portion of the integrated circuit and a portion of the MEMS acoustic transducer overlap when viewed from the thickness direction of the integrated circuit, and
   wherein the MEMS acoustic transducer is secured relative to the inner surface of the sound port bearing partition of the housing and an exposed surface of the integrated circuit housed inside the recess.

4. The microphone according to claim 3, further comprising:
   a first and a second electrode arranged on the front surface of the membrane in the MEMS acoustic transducer on a region of the MEMS acoustic transducer overlapping with a portion of the integrated circuit when viewed from the thickness direction of the integrated circuit, the first and second electrodes electrically connected to the diaphragm and the fixed electrode respectively of the MEMS acoustic transducer; and
   a third electrode and a fourth electrode that connect to the first and second electrodes respectively, arranged on the exposed surface of the integrated circuit in a region on the integrated circuit overlapping with a portion of the MEMS acoustic transducer when viewed from the thickness direction of the integrated circuit, the third and fourth electrodes having the same positional relationship as the positional relationship between the first and second electrodes,
   wherein the first electrode on the MEMS acoustic transducer and the third electrode on the integrated circuit, and the second electrode on the MEMS acoustic transducer and the fourth electrode on the integrated circuit are connected via flip chip bonding.

5. The microphone according to claim 4, further comprising: a recess provided on the inner surface of the sound port bearing partition of the housing where a sidewall of the integrated circuit housed in the recess that houses a circuit facing the center portion of the membrane on the MEMS acoustic transducer serves as a portion of the inner side-surface of the recess.

6. The microphone according to claim 3, further comprising: a recess provided on the inner surface of the sound port bearing partition of the housing where a sidewall of the integrated circuit housed in the recess that houses a circuit facing the center portion of the membrane on the MEMS acoustic transducer serves as a portion of the inner side-surface of the recess.

7. The microphone according to claim 6, wherein the recess is provided facing a region containing a region hindering the spread of a die bonding material on the membrane of the MEMS acoustic transducer.

* * * * *